(12) United States Patent
Nakamura et al.

(10) Patent No.: US 10,665,091 B2
(45) Date of Patent: May 26, 2020

(54) INFORMATION SETTING DEVICE AND ELECTRONIC APPLIANCE

(71) Applicant: Yazaki Corporation, Tokyo (JP)

(72) Inventors: Yoshihide Nakamura, Shizuoka (JP); Satoshi Morita, Shizuoka (JP); Yasuyuki Shigezane, Shizuoka (JP); Yoshinori Ikuta, Shizuoka (JP); Shuuji Satake, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/970,840

(22) Filed: May 3, 2018

(65) Prior Publication Data

US 2019/0005810 A1 Jan. 3, 2019

(30) Foreign Application Priority Data

Jun. 29, 2017 (JP) ................................ 2017-127506

(51) Int. Cl.
| | | |
|---|---|---|
| G08C 19/02 | (2006.01) | |
| G05F 1/70 | (2006.01) | |
| H03K 7/08 | (2006.01) | |
| G05B 19/042 | (2006.01) | |
| G05B 19/12 | (2006.01) | |

(52) U.S. Cl.
CPC ........ *G08C 19/025* (2013.01); *G05B 19/0423* (2013.01); *G05F 1/70* (2013.01); *H03K 7/08* (2013.01); *G05B 19/12* (2013.01); *G05B 2219/31034* (2013.01)

(58) Field of Classification Search
CPC .... G06F 13/4282; G08C 19/025; H03K 7/08; G05F 1/70; G05B 2219/31034; G05B 19/12
See application file for complete search history.

(56) References Cited

U.S. PATENT DOCUMENTS

| | | | | | |
|---|---|---|---|---|---|
| 5,583,819 | A | * | 12/1996 | Roesner | ............. G06K 19/0723 235/380 |
| 6,775,323 | B1 | * | 8/2004 | Vasudevan Pillai | ........................ G01S 13/751 340/10.4 |

(Continued)

FOREIGN PATENT DOCUMENTS

| | | |
|---|---|---|
| EP | 2 393 003 A1 | 12/2011 |
| JP | 7-333265 A | 12/1995 |

(Continued)

OTHER PUBLICATIONS

German Office Action for the related German Patent Application No. 10 2018 206 998.0 dated Apr. 1, 2019.

(Continued)

*Primary Examiner* — Thomas J. Hiltunen
(74) *Attorney, Agent, or Firm* — Kenealy Vaidya LLP (57) ABSTRACT

An ID setting device includes: an output circuit configured to output, as serial data, an ID to be set in an ECU, which is an ID setting target; an input circuit to which an ID that is set is input as serial data from the ECU; and a control unit configured to check the ID output by the output circuit and the ID input to the input circuit against each other. The serial data has a duty cycle which is according to setting data on a per bit basis.

5 Claims, 6 Drawing Sheets

(56) References Cited

U.S. PATENT DOCUMENTS

| | | | | |
|---|---|---|---|---|
| 7,193,504 | B2* | 3/2007 | Carrender | G06K 7/0008 |
| | | | | 340/10.4 |
| 7,274,286 | B2* | 9/2007 | Tagato | G06Q 10/087 |
| | | | | 235/375 |
| 7,366,815 | B2* | 4/2008 | Kadowaki | H04L 5/16 |
| | | | | 710/110 |
| 7,474,234 | B2* | 1/2009 | Wagensohner | H03M 5/08 |
| | | | | 341/50 |
| 7,836,232 | B2* | 11/2010 | Lee | G06F 13/4286 |
| | | | | 709/230 |
| 8,068,013 | B2* | 11/2011 | Otsuka | G08C 17/02 |
| | | | | 340/10.5 |
| 8,102,244 | B2* | 1/2012 | Smith | G06K 7/0008 |
| | | | | 340/10.2 |
| 8,228,193 | B1* | 7/2012 | Turner | G06K 19/0723 |
| | | | | 340/10.34 |
| 8,864,027 | B2* | 10/2014 | Mickle | G06K 19/0701 |
| | | | | 235/435 |
| 9,152,370 | B2* | 10/2015 | Kim | G06F 3/1423 |
| 2002/0101884 | A1* | 8/2002 | Pohlmeyer | H04L 7/044 |
| | | | | 370/509 |
| 2005/0050325 | A1* | 3/2005 | Ohkubo | G06F 21/31 |
| | | | | 713/168 |
| 2005/0152388 | A1 | 7/2005 | Ishiguro et al. | |
| 2007/0274242 | A1* | 11/2007 | Lamacraft | G06K 19/0723 |
| | | | | 370/310 |
| 2009/0234981 | A1* | 9/2009 | Umeda | G08C 17/02 |
| | | | | 710/18 |
| 2011/0276975 | A1* | 11/2011 | Brown | G06F 3/162 |
| | | | | 718/103 |
| 2015/0153994 | A1 | 6/2015 | Ueda et al. | |
| 2015/0213745 | A1 | 7/2015 | Kim et al. | |

FOREIGN PATENT DOCUMENTS

| | | |
|---|---|---|
| JP | 9-34810 A | 2/1997 |
| JP | 2001-160832 A | 6/2001 |
| JP | 2002-23776 A | 1/2002 |
| JP | 2002-95241 A | 3/2002 |
| JP | 2014-119766 A | 6/2014 |

OTHER PUBLICATIONS

Digital Data Transmission; "Übungen zu PC-Hardware für Wissenschaftler"; Summer Semester 2016; University of Vienna, Faculty of Physics; archived on Mar. 28, 2016 via Wayback Machine; URL:https://web.archive.org/web/20160328074925/www.univie.ac.at/photovoltaik/cose/dig dat.pdf.

Wikipedia article; "Serial data transmission"; version dated Jan. 2, 2017; https://de.wjkjpedia.org/w/index.php?title=Serielle_Daten%C3%BCbertragungs&oldid=161206349.

\* cited by examiner

FIG.1

| CONTENTS | On_Duty |
|---|---|
| END | 10% |
| DATA 0b | 30% |
| DATA 1b | 70% |
| START | 90% |
| CONNECTION CONFIRMATION | 100% |

FIG.2

| SIGNAL | STARTbit | DATAbit(e.g. 8bit) | | | | | | | | ENDbit |
|---|---|---|---|---|---|---|---|---|---|---|
| | | bit7 | bit6 | bit5 | bit4 | bit3 | bit2 | bit1 | bit0 | |
| CONNECTION CONFORMATION SIGNAL CONNECTION COMPLETION SIGNAL | On_Duty 90% | On_Duty 100% | On_Duty 100% | On_Duty 100% | On_Duty 100% | On_Duty 100% | On_Duty 100% | On_Duty 100% | On_Duty 100% | On_Duty 10% |
| ID:00100111 | On_Duty 90% | On_Duty 30% | On_Duty 30% | On_Duty 70% | On_Duty 30% | On_Duty 30% | On_Duty 70% | On_Duty 70% | On_Duty 70% | On_Duty 10% |

| OUTPUT DATA SETTING | OUTPUT DATA[V] |
|---|---|
| CONNECTION CONFIRMATION DATA | 5 |
| START DATA | 4 |
| ID DATA:1 | 3 |
| ID DATA:0 | 2 |
| END DATA | 1 |

FIG.6

| SIGNAL | STARTbit | DATAbit(e.g. 8bit) | | | | | | | | ENDbit |
|---|---|---|---|---|---|---|---|---|---|---|
| | | bit7 | bit6 | bit5 | bit4 | bit3 | bit2 | bit1 | bit0 | |
| CONNECTION CONFORMATION SIGNAL / CONNECTION COMPLETION SIGNAL | 4V | 5V | 5V | 5V | 5V | 5V | 5V | 5V | 5V | 1V |
| ID:00100111 | 4V | 2V | 2V | 3V | 2V | 2V | 3V | 3V | 3V | 1V |

INFORMATION SETTING DEVICE AND ELECTRONIC APPLIANCE

BACKGROUND

Technical Field

The present disclosure relates to an information setting device for setting information such as an ID in an electronic appliance, and an electronic appliance.

Related Art

Conventionally, IDs are sometimes set in electronic appliances so as to distinguish between the electronic appliances. For example, JP 07-333265 A discloses an ID setting device which detects of a value of a variable resistor by an AD converter, and a control unit which recognizes an ID by based on the detected value.

Patent Literature 1: JP 07-333265 A

SUMMARY

Technical Problem

However, according to the method disclosed in JP 07-333265 A, if the number of bits of an ID is increased, the number of variable resistors and AD converters may be increased, thus increasing the circuit scale, and resulting in problems such as an increased size of a substrate and an increased cost.

Accordingly, in view of the problems described above, the present disclosure has its object to provide an information setting device and an electronic appliance which are capable of suppressing an increase in the size of a substrate and an increase in the cost.

Solution to Problem

The invention made to solve the problem is an information setting device including: an output unit configured to output, as serial data, information to be set in a setting target; an input unit to which information set in the setting target is input as the serial data from the setting target; and a checking unit configured to check the information output by the output unit and the information input to the input unit against each other.

According to the present disclosure as described above, because information to be set in a setting target is serial data, the circuit scale is not increased even if the number of bits is increased. Accordingly, an increase in the size of a substrate and an increase in the cost may be suppressed.

DETAILED DESCRIPTION

First Embodiment

Figure 1:
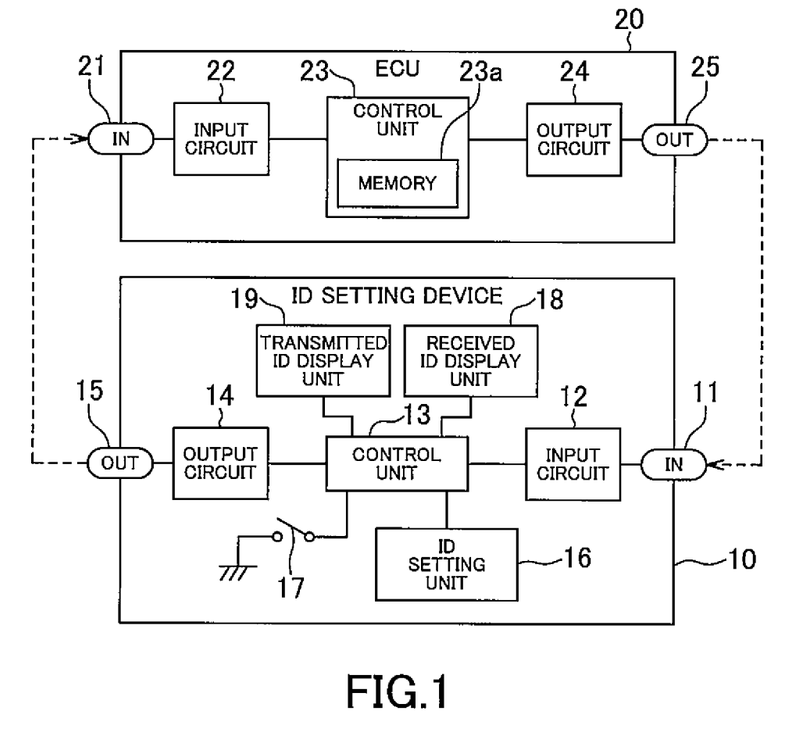
FIG. 1 is a functional block diagram of an information setting device and an electronic appliance according to a first embodiment of the present disclosure.

Hereinafter, a first embodiment of the present disclosure will be described with reference to the drawings. FIG. 1 is a functional block diagram of an information setting device and an electronic appliance according to the embodiment of the present disclosure.

An ID setting device 10 as the information setting device shown in FIG. 1 is a device for setting, in an electronic control unit (ECU) 20 as a setting target, an ID as information which is to be set. The ID setting device 10 includes an input terminal 11, an input circuit 12, a control unit 13, an output circuit 14, an output terminal 15, an ID setting unit 16, a processing start switch 17, a received ID display unit 18, and a transmitted ID display unit 19.

The input circuit 12 receives serial data input to the input terminal 11 from an output terminal 25 of the ECU 20.

The control unit 13 is configured by a microcomputer including a central processing unit (CPU) and the like, and based on operation of the processing start switch 17, the control unit 13 acquires an ID as setting information to be set from the ID setting unit 16, converts the ID into serial data, and outputs the serial data to the output circuit 14. Furthermore, the control unit 13 checks an ID recovered from serial data input from the input circuit 12 and the ID output to the output circuit 14, and determines whether the IDs coincide with each other or not. Additionally, a signal input unit of the control unit 13 for the input circuit 12 is capable of measuring time from a point of change in a signal, such as rise or fall, by an input capture function or the like.

The output circuit 14 outputs an ID, which is output from the control unit 13, from the output terminal 15 to an input terminal 21 of the ECU 20.

An ID to be set in the ECU 20 is set in the ID setting unit 16. The ID to be set in the ID setting unit 16 may be set by a switch or the like, or may be externally input.

The processing start switch 17 is configured by a switch such as a push button, and when turned on, the processing start switch 17 causes the control unit 13 to start execution of an ID setting process.

The received ID display unit 18 is configured by a liquid crystal display (LCD) or the like, and displays an ID which is recovered from serial data input to the input circuit 12.

The transmitted ID display unit 19 is configured by a liquid crystal display (LCD) or the like, and displays an ID acquired by the control unit 13 from the ID setting unit and output to the output circuit 14.

That is, the control unit 13 and the output circuit 14 function as an output unit for outputting, as serial data, information which is to be set in a setting target. Furthermore, the control unit 13 functions as a checking unit for checking information output from the output unit and information input to an input unit against each other. Moreover, the control unit 13 and the input circuit 12 function as the input unit to which information set in a setting target is input as serial data from the setting target.

The ECU 20 shown in FIG. 1 includes the input terminal 21, an input circuit 22, a control unit 23, an output circuit 24, and the output terminal 25.

The input circuit 22 receives serial data input from the output terminal 15 of the ID setting device 10 to the input terminal 21.

The control unit 23 is configured by a microcomputer including a central processing unit (CPU) and the like, and further includes a memory 23a for storing an ID which has been set. For example, the memory 23a is a non-volatile memory such as a flash memory. The control unit 23 recovers an ID from serial data input from the input circuit 22, and sets (writes) the ID in the memory 23a as a setting unit. Furthermore, the control unit 23 reads the ID set in the memory 23a, converts the ID into serial data, and outputs the serial data to the output circuit 24. Additionally, as in the case of the control unit 13, a signal input unit of the control unit 23 for the input circuit 22 is capable of measuring time from a point of change in a signal, such as rise or fall, by an input capture function or the like.

The output circuit 24 outputs an ID, which is output from the control unit 23, from the output terminal 25 to the input terminal 11 of the ID setting device 10.

That is, the control unit 23 and the input circuit 22 function as an input unit to which setting information is input as serial data. Furthermore, the control unit 23 functions as a control unit for setting setting information in a setting unit based on serial data input from the input unit. Moreover, the control unit 23 and the output circuit 24 function as an output unit for reading setting information set by the control unit from the setting unit, and outputting the setting information as serial data.

As shown in FIG. 1, at the time of setting of an ID in the ECU 20 by the ID setting device 10, the output terminal 15 of the ID setting device 10 and the input terminal 21 of the ECU 20 are connected, and the output terminal 25 of the ECU 20 and the input terminal 11 of the ID setting device 10 are connected. The ID setting device 10 and the ECU 20 may also be connected by a cable or the like by including dedicated terminals, or a probe or the like connected to the output terminal 15 of the ID setting device 10 may be placed in contact with a pad or the like which is used as the input terminal 21 of the ECU 20 to achieve connection. A dedicated terminal, a probe or the like may prevent sudden writing of an ID.

Next, an example of serial data in the present embodiment will be described with reference to FIGS. 2 and 3. With the serial data in the present embodiment, each bit is a PWM signal of a constant frequency, and a duty cycle is according to setting data on a per bit basis.

In the present embodiment, contents of data are specified by a proportion of a High-level period (On_Duty) in one bit period. FIG. 2 is an example of a correspondence table of On_Duty and data contents. In the case shown in FIG. 2, On_Duty of 10% is an END bit, On_Duty of 30% is data "0", On_Duty of 70% is data "1", On_Duty of 90% is a START bit, and On_Duty of 100% is connection confirmation.

Figure 2:
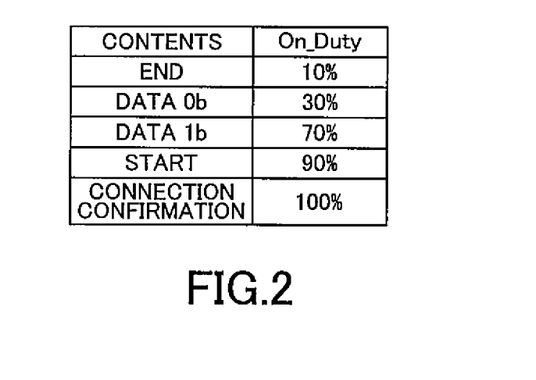
FIG. 2 is an example of a correspondence table of On_Duty and data contents.

As shown in FIG. 2, in the present embodiment, a START bit and an END bit for synchronization have to be transmitted in addition to pieces of data "0" and "1", and the duty cycle is changed to enable identification of the four. The duty cycle can be identified because, when time from a rise or fall of a signal is measured by the input capture function of the control unit 13, 23, the frequency of each bit of serial data is constant, or in other words, the cycle is constant. By changing the duty cycle in the above manner, a portion where the signal changes from High level to Low level, or from Low level to High level is caused, and synchronization is facilitated, and the reliability of data is increased.

Figure 3:
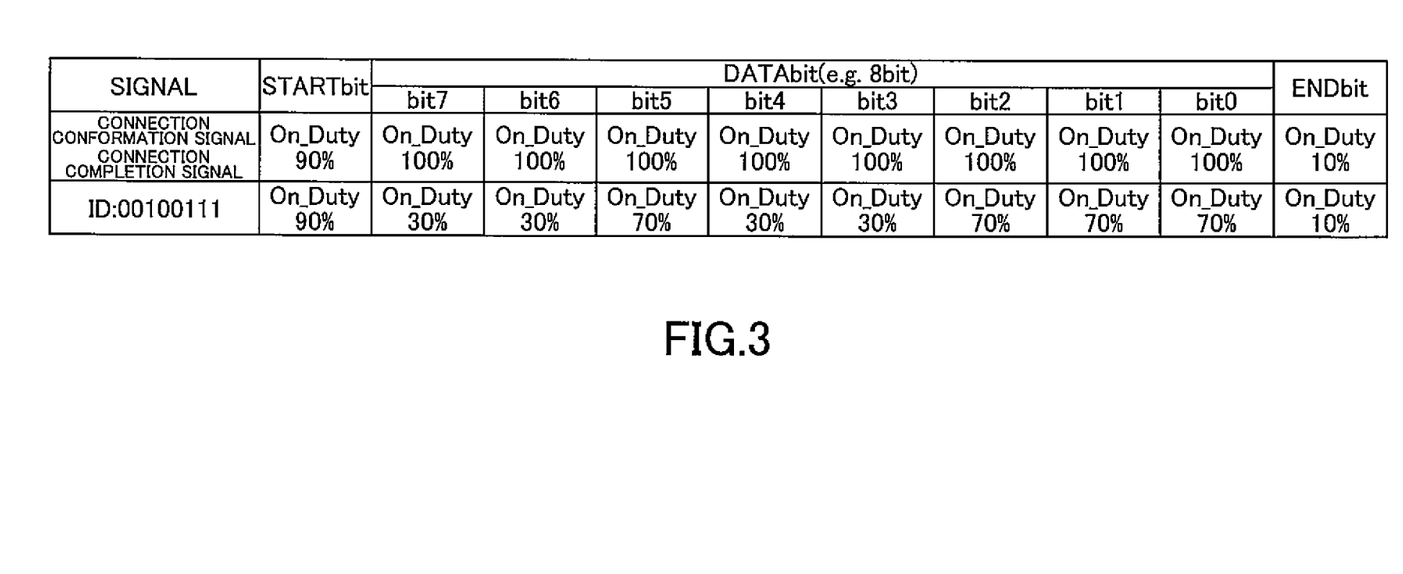
FIG. 3 is an example of serial data constructed according to the correspondence table shown in FIG. 2.

FIG. 3 is an example of serial data constructed according to the correspondence table shown in FIG. 2. In FIG. 3, data is constructed from one START bit, eight data bits, and one END bit. The START bit and the END bit are information for synchronization.

An upper portion in FIG. 3 is an example showing a connection confirmation signal or a connection completion signal. A connection confirmation signal is a signal that is output from the ID setting device 10 to the ECU 20, and the connection completion signal is a signal that is output from the ECU 20 to the ID setting device 10. These signals take a structure of a START bit, eight consecutive connection confirmation bits, and an END bit. When expressed in terms of On_Duty, this is "90%, 100%, 100%, 100%, 100%, 100%, 100%, 100%, 100%, 10%".

A lower portion in FIG. 3 is an example of an ID "00100111". In this case, the structure is a START bit, data "0", data "0", data "1", data "0", data "0", data "1", data "1", data "1", an END bit. When expressed in terms of On_Duty, this is "90%, 30%, 30%, 70%, 30%, 30%, 70%, 70%, 70%, 10%".

Next, operations of the ID setting device 10 and the ECU 20 described above will be described with reference to the flowchart shown in FIG. 4.

First, the ID setting device 10 is connected to the ECU 20 by a cable or the like (step S101), and an ID to be set in the ECU 20 is set in the ID setting unit 16 (step S102).

Next, when the processing start switch 17 is turned on (step S103), the control unit 13 transmits a connection confirmation signal (see the upper portion in FIG. 3) (step S104).

For its part, the ECU 20 is connected to the ID setting device 10 by the cable or the like (step S201), and in the case where a connection confirmation signal is received from the ID setting device 10 within a predetermined period of time (step S202: Y), the control unit 23 activates a write program of the memory 23a (step S203), and transmits a connection completion signal (see the upper portion in FIG. 3) (step S204).

The predetermined period of time in step S202 is a time of waiting for a signal from the ID setting device 10 after connection to the ID setting device 10, and may be set as appropriate according to hardware and software configurations of the ID setting device 10 and the ECU 20.

Next, when the connection completion signal is received at the ID setting device 10 within a set period of time (step S105: Y), the control unit 13 transmits the ID set in the ID setting unit 16 to the ECU 20 (step S106). That is, the ID is converted into a serial signal by the control unit 13 by the method as illustrated in FIGS. 2 and 3, and the serial signal is output from the output circuit 14.

The set period of time in step S105 is a time until a response is received from the ECU 20 with respect to the connection confirmation signal, and may be set as appropriate according to hardware and software configurations of the ID setting device 10 and the ECU 20.

For its part, when the ECU 20 receives an ID within a set period of time (step S205: Y), the control unit 23 recovers the ID from serial data, and performs an ID write process in the memory 23a by the activated memory write program (step S206). In the case of success of the write process (step S207: Y), the control unit 23 reads the ID written in the memory 23a (step S208), converts the ID into a serial signal, and outputs (transmits) the serial signal from the output circuit 24 to the ID setting device 10 (step S209).

The set period of time in step S205 is a time after transmission of a connection completion signal to when an ID is set by the ID setting device 10, and may be set as appropriate according to hardware and software configurations of the ID setting device 10 and the ECU 20. Furthermore, determination of success or failure of writing in the memory 23a may be performed by a known verification process, for example.

Next, in the case where the ID is received at the ID setting device 10 within a set period of time (step S107: Y), the control unit 13 determines whether the received ID coincides with the ID transmitted in step S106, and in the case of coincidence, the control unit 13 ends the ID setting process in a normal manner (step S108: Y).

The set period of time in step S107 is a time after transmission of an ID to when an ID is transmitted from the ECU 20, and may be set as appropriate according to hardware and software configurations of the ID setting device 10 and the ECU 20.

In the case where the ID setting device 10 does not receive a signal from the ECU 20 within the set period of time in steps S105 and S107 (case of N), the ID setting process is stopped (step S109). The ID setting process is also stopped (step S109) in a case where the received ID and the transmitted ID do not coincide with each other in step S108 (case of N). In the case where the process is stopped, an error message or the like may be displayed on the received ID display unit 18 or the transmitted ID display unit 19, for example. At this time, the step where an error was caused may be displayed instead of a simple error, or re-setting may be performed.

In the case where the ECU 20 does not, in step S205, receive an ID from the ID setting device 10 within the set period of time (case of N), the ID setting process is stopped (step S210). The ID setting process is also stopped (step S210) in a case where the write process in the memory 23a in step S207 has failed (case of N). At this time, the ID setting device 10 may be notified of the error. Alternatively, the ID setting device 10 may be requested to perform re-setting.

According to the present embodiment, the ID setting device 10 includes the output circuit 14 for outputting, as serial data, an ID to be set in the ECU 20, which is an ID setting target, the input circuit 12 to which an ID set in the ECU 20 is input as serial data, and the control unit 13 for checking the ID output by the output circuit 14 and the ID input to the input circuit 12 against each other. The serial data has a duty cycle which is according to setting data on a per bit basis. Accordingly, because the ID data is serial data, only the software or the like needs to be changed even if the number of bits of an ID is increased, and the circuit scale is not increased. Furthermore, an inexpensive and small microcomputer not requiring an AD converter can be used, for example. Therefore, an increase in the size of the substrate and an increase in the cost can be suppressed.

Moreover, the serial data is a PWM signal of a constant frequency, and does not require a variable resistor, an AD converter and the like. Furthermore, synchronization on a per bit basis is facilitated, and the duty cycle can be easily detected.

Moreover, an input portion of the control unit 13 has an input capture function enabling measurement of time from a point of change in a signal, and thus, detection of the duty cycle is facilitated.

Furthermore, the ECU 20 includes the input circuit 22 to which an ID to be set is input as serial data, the control unit 23 for setting an ID in the memory 23a based on the serial data input from the input circuit 22, and the output circuit 24 for reading the ID set by the control unit 23 from the memory 23a, and outputting the ID as serial data. Moreover, the serial data has a duty cycle which is according to setting data on a per bit basis. Accordingly, because the ID data is serial data, the circuit scale is not increased even if the number of bits is increased. Therefore, an increase in the size of the substrate and an increase in the cost can be suppressed. Moreover, the result of writing at the ECU 20 can be checked at the ID setting device 10. That is, a change in data between the ID setting device 10 and writing in the memory 23a, which cannot be detected by checking success or failure of writing in the memory 23a, can be detected, and ID writing accuracy can be increased.

Second Embodiment

Next, a second embodiment of the present disclosure will be described with reference to FIGS. 5 to 8. Additionally, parts the same as those in the first embodiment described above will be denoted by the same reference signs, and a description thereof will be omitted.

Figure 5:
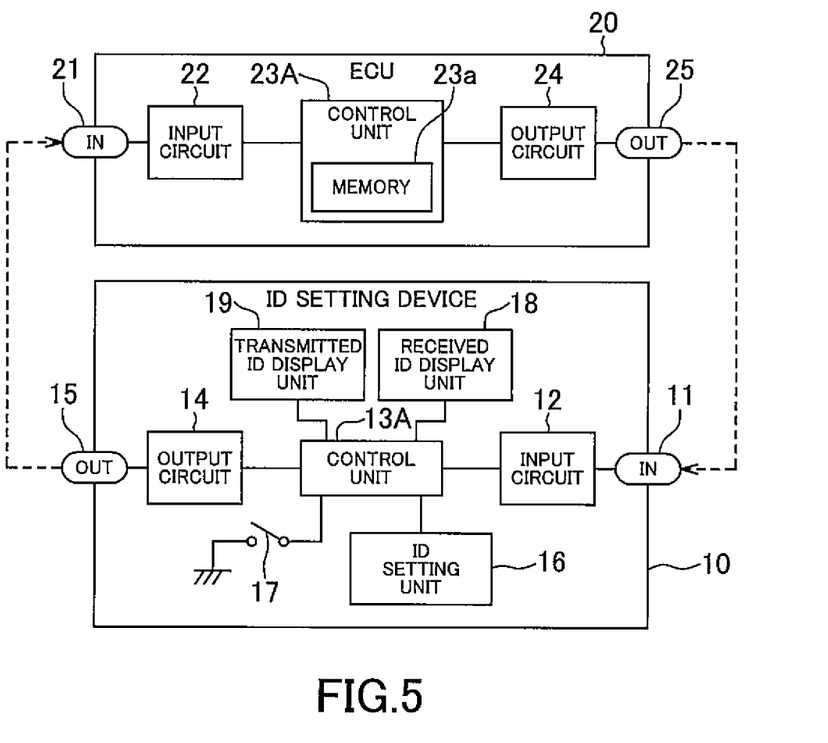
FIG. 5 is a functional block diagram of an information setting device and an electronic appliance according to a second embodiment of the present disclosure.

In the first embodiment, the ID that is output from the ID setting device 10 is a signal with different duty cycles, but in the present embodiment, the ID is output as a multi-valued voltage value.

A basic configuration of an ID setting device 10A according to the present embodiment is similar to that in the first embodiment, but the control unit 13 is changed to a control unit 13A. The control unit 13A includes an AD converter at a signal input unit for the input circuit 12, and a DA converter at a signal output unit for the output circuit 14. An ID is thus transmitted/received as a multi-valued ID (analog values).

Furthermore, a basic configuration of an ECU 20A according to the present embodiment is similar to that in the first embodiment, but the control unit 23 is changed to a control unit 23A. The control unit 23A includes an AD converter at a signal input unit for the input circuit 22, and a DA converter at a signal output unit for the output circuit 24. An ID is thus transmitted/received as a multi-valued ID.

Figure 6:
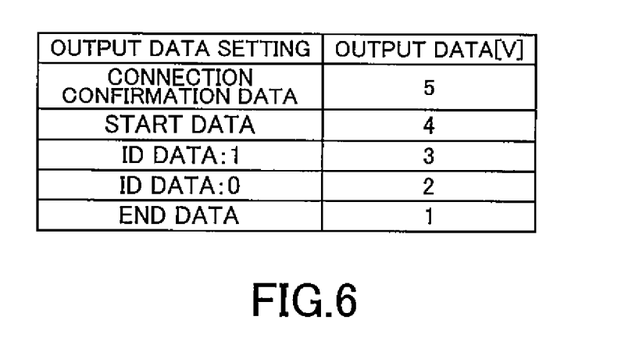
FIG. 6 is an example of a correspondence table of output data contents and an output value (voltage value)

FIG. 6 is an example of a correspondence table of output data contents and an output value (voltage value). In the case in FIG. 6, when the output data contents are connection confirmation, the output value is 5V; when the output data contents are START, the output value is 4V; when the output data contents are data "1", the output value is 3V; when the output data contents are data "0", the output value is 2V; and when the output data contents are END, the output value is 1V. That is, the output values are not digital values, but are three or more multiple values. That is, a voltage value according to the output data contents is output from the control unit 13A.

As shown in FIG. 6, in the present embodiment, a START bit and an END bit for synchronization have to be transmitted in addition to pieces of data "0" and "1", and the voltage value are changed to enable identification of the four.

Figure 7:
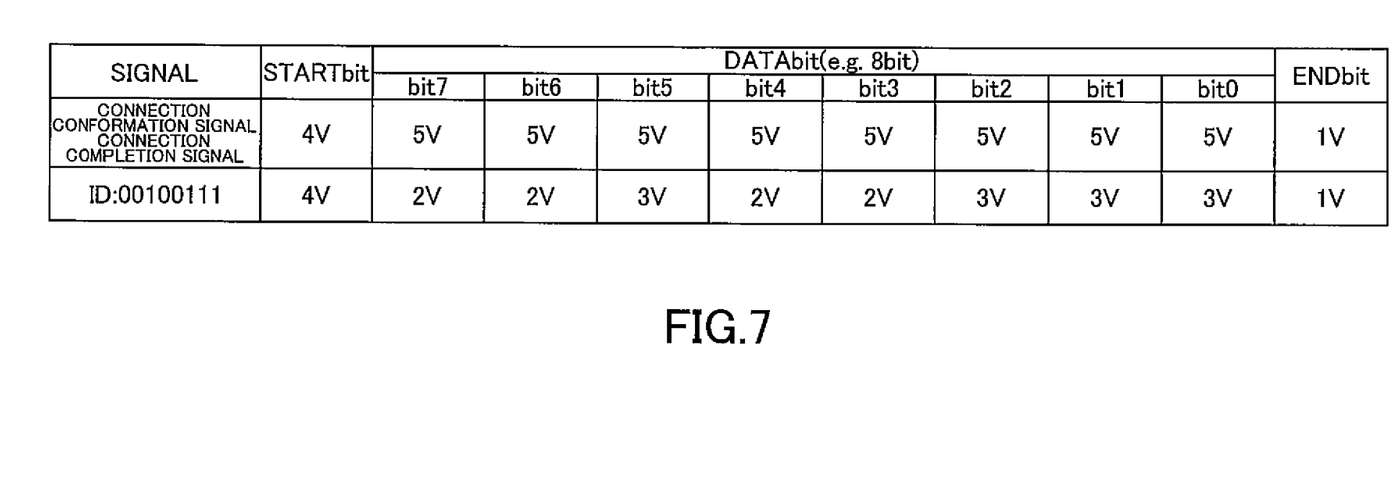
FIG. 7 is an example of analog information constructed according to the correspondence table shown in FIG. 6.

FIG. 7 is an example of serial data constructed according to the correspondence table shown in FIG. 6. In FIG. 7, data is constructed from one START bit, eight data bits, and one END bit. The term "bit" is used in FIG. 7 for the sake of convenience, but this refers to a period when one type of output data contents is indicated.

An upper portion in FIG. 7 is an example showing a connection confirmation signal or a connection completion signal. In this case, a structure of a START bit, eight consecutive connection confirmation bits, and an END bit is adopted. When expressed in terms of voltage value, this is "4V, 5V, 5V, 5V, 5V, 5V, 5V, 5V, 5V, 1V".

A lower portion in FIG. 7 is an example of an ID "00100111". In this case, the structure is a START bit, data "0", data "0", data "1", data "0", data "0", data "1", data "1", data "1", an END bit. When expressed in terms of voltage value, this is "4V, 2V, 2V, 3V, 2V, 2V, 3V, 3V, 3V, 1V". In this manner, in the present embodiment, data periods obtained by time division are expressed by respective values.

Figure 8:
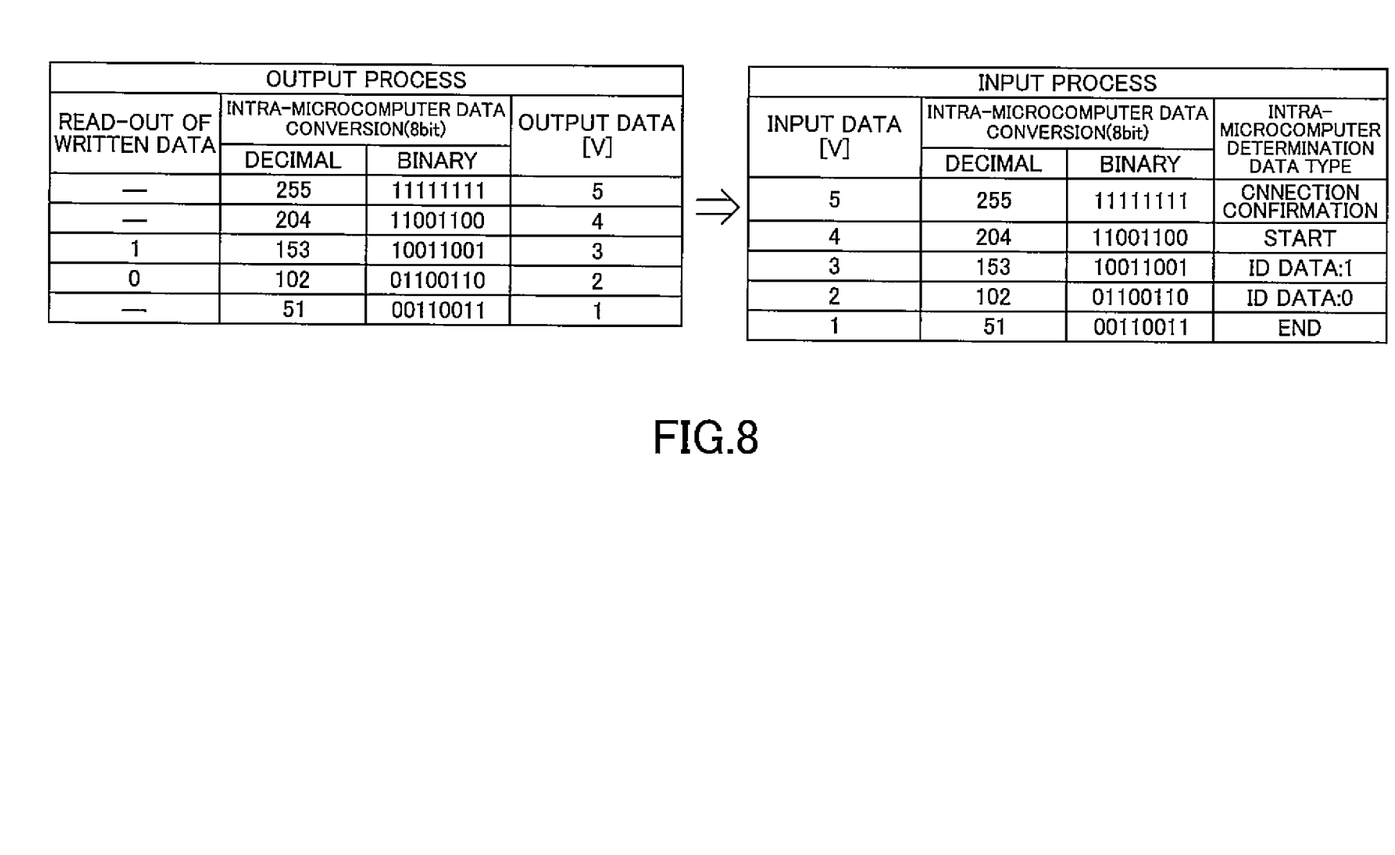
FIG. 8 is an explanatory diagram showing an output process at a control unit shown in FIG. 5 and an input process at a control unit shown in FIG. 5.

FIG. 8 is an explanatory diagram showing an output process at the control unit 13A and an input process at the control unit 23A. A left side in FIG. 8 is the output process at the control unit 13A. For example, in the case of connection confirmation, the control unit 13A converts "256" in decimal corresponding to connection confirmation into binary, and inputs "11111111" in binary to the DA converter (decimal does not have to be used in the first place). Then, 5V is output from the DA converter. Furthermore, in the case of data "1" in an ID to be transmitted, the control unit 13A converts "153" in decimal to binary, and inputs "10011001" to the DA converter. Then, 3V is output from the DA converter.

A right side in FIG. 8 is the input process at the control unit 23A. For example, in the case where a voltage value of 5V is input to the AD converter, "11111111" in binary is obtained from the AD converter, and "256" in decimal is obtained. Connection confirmation may thus be determined. Additionally, connection confirmation may be determined directly from "11111111" in binary. Furthermore, in the case where a voltage value of 3V is input to the AD converter, "10011001" in binary is obtained from the AD converter, and "153" in decimal is obtained. Data "1" may thus be determined.

Figure 4:
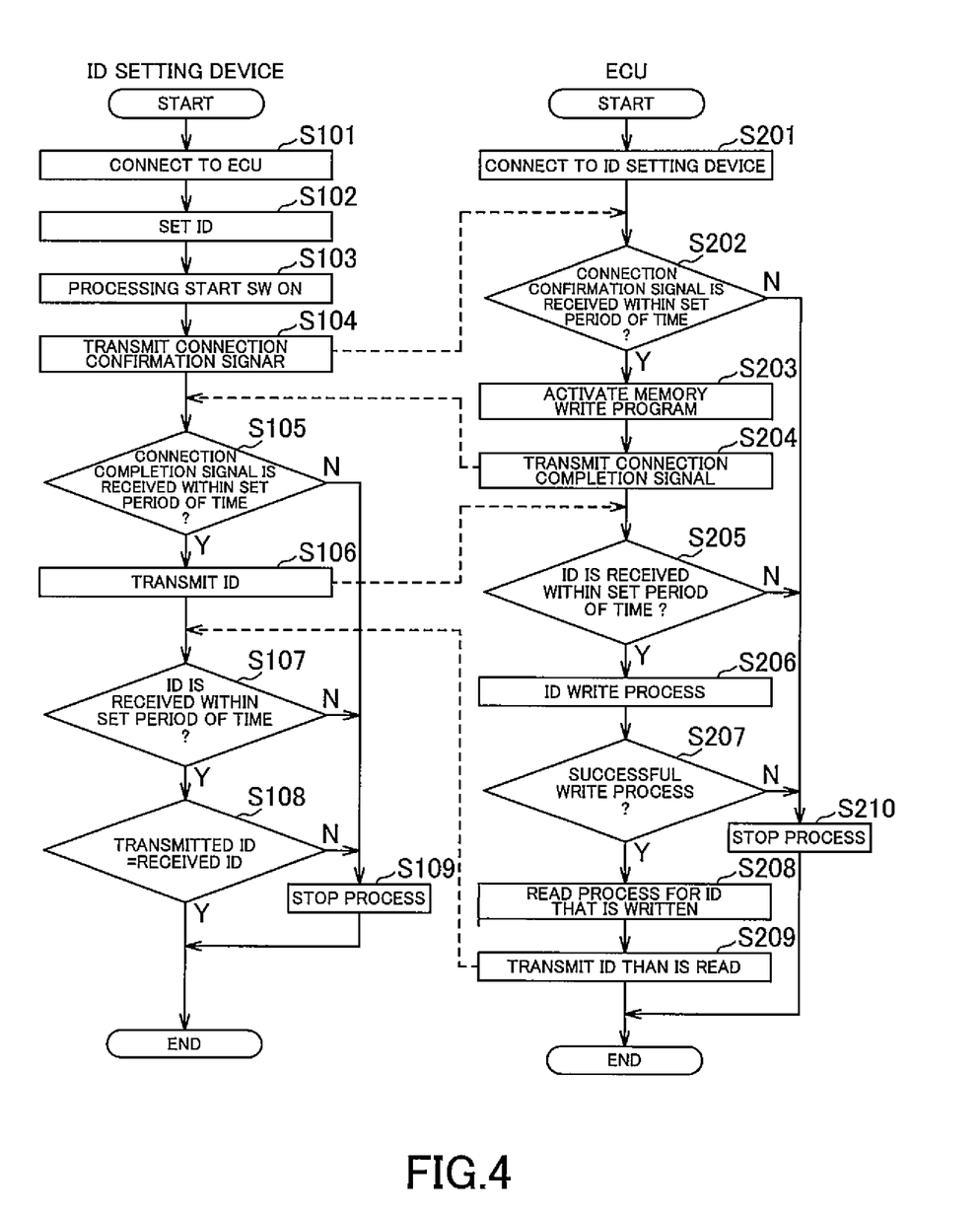
FIG. 4 is a flowchart of operations of the ID setting device and the ECU shown in FIG. 1.

Operations of the ID setting device 10A and the ECU 20A described above are similar to those indicated by the flowchart in FIG. 4.

According to the present embodiment, the ID setting device 10A includes the output circuit 14 for outputting, as serial data, an ID to be set in an ID setting target, the input circuit 12 to which an ID which is set is input as serial data from the ECU 20A, and the control unit 13A for checking the ID output by the output circuit 14 and the ID input to the input circuit 12 against each other. Moreover, the voltage value is a multi-valued voltage value which is according to setting contents on a per predetermined cycle basis. Accordingly, because the ID is a voltage value which is changed in a time division manner, only one signal line is used, and only the software or the like needs to be changed even if the number of bits of an ID is increased, and the circuit scale is not increased. Therefore, an increase in the size of the substrate and an increase in the cost can be suppressed.

Furthermore, a DA converter and an AD converter for only one channel are required, and thus, even if the number of bits of an ID is increased, the circuit scale is not increased. Moreover, the DA converter and the AD converter which are for one channel and are thus relatively inexpensive and small can be used.

Furthermore, because information corresponding to one bit may be made multi-valued by being converted into a voltage value by the DA converter, the amount of information to be transmitted can be increased.

Furthermore, the ECU 20A includes the input circuit 22 to which an ID to be set is input as serial data, the control unit 23A for setting an ID in the memory 23a based on the serial data input from the input circuit 22, and the output circuit 24 for reading the ID set by the control unit 23A from the memory 23a, and outputting the ID as serial data. Moreover, the serial data is a multi-valued voltage value which is according to setting contents on a per predetermined cycle basis. Accordingly, because the ID is a voltage value which is changed in a time division manner, only one signal line is used, and the circuit scale is not increased even if the number of bits of an ID is increased. Therefore, an increase in the size of the substrate and an increase in the cost can be suppressed. Moreover, the result of writing at the ECU 20A can be checked at the ID setting device 10A, and thus, ID writing accuracy can be increased.

Additionally, in the two embodiments described above, an ID of an ECU is set, but application in a case of setting a unique ID of a communication terminal or the like is also possible, for example. Furthermore, application in a case of setting setting information such as initial setting data is also possible, without being restricted to an ID.

Moreover, the present invention is not limited to the embodiments described above. That is, a person skilled in the art can make various modifications according to conventional knowledge, without departing from the gist of the present invention. Such modifications are, of course, included in the category of the present invention as long as the configurations of the ID setting device and the electronic appliance of the present invention are realized in the modifications.

REFERENCE SIGNS LIST

10 ID setting device (information setting device)
12 input circuit (input unit)
13, 13A control unit (input unit, control unit, output unit)
14 output circuit (output unit)
20 ECU (electronic appliance)
22 input circuit (input unit)
23, 23A control unit (input unit, control unit, output unit)
24 output circuit (output unit)

What is claimed is:

1. An information setting device comprising:
an output unit configured to output, as serial data, information to be set in a setting target;
an input unit to which information set in the setting target is input as the serial data from the setting target; and
a checking unit configured to check the information output by the output unit and the information input to the input unit against each other,
wherein the serial data has a duty cycle that is according to setting data on a per bit basis, and
wherein duty ratios of an END bit, data "0", data "1", a START bit, and connection confirmation are respectively changed,
wherein each bit is a PWM signal of a constant frequency.

2. The information setting device according to claim 1, wherein the serial data is a PWM signal of a constant frequency.

3. The information setting device according to claim 1, wherein the input unit is capable of measuring time from a point of change in a signal.

4. An electronic appliance comprising:
an input unit to which setting information is input as serial data from the information setting device according to claim 1;

a control unit configured to set the setting information in a setting unit based on the serial data input from the input unit; and an output unit configured to read the setting information set by the control unit from the setting unit, and to output the setting information as the serial data to the information setting device.

5. An electronic appliance comprising:

an input unit to which setting information is input as serial data from the information setting device according to claim 2;

a control unit configured to set the setting information in a setting unit based on the serial data input from the input unit; and an output unit configured to read the setting information set by the control unit from the setting unit, and to output the setting information as the serial data to the information setting device.

* * * * *